United States Patent
Kim et al.

(10) Patent No.: US 10,845,181 B2
(45) Date of Patent: Nov. 24, 2020

(54) SECONDARY BATTERY EVALUATION APPARATUS

(71) Applicant: LG CHEM, LTD., Seoul (KR)

(72) Inventors: Dong-Yeon Kim, Daejeon (KR);
Jin-Hak Kong, Daejeon (KR);
Yong-Seok Choi, Daejeon (KR);
Sung-Won Seo, Daejeon (KR);
Yoon-Koo Lee, Daejeon (KR); Dal-Mo Kang, Daejeon (KR); Jeong-O Mun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 118 days.

(21) Appl. No.: 16/080,619

(22) PCT Filed: Jan. 23, 2018

(86) PCT No.: PCT/KR2018/001008
§ 371 (c)(1),
(2) Date: Aug. 28, 2018

(87) PCT Pub. No.: WO2018/139833
PCT Pub. Date: Aug. 2, 2018

(65) Prior Publication Data
US 2019/0094003 A1 Mar. 28, 2019

(30) Foreign Application Priority Data
Jan. 24, 2017 (KR) .................. 10-2017-0011228

(51) Int. Cl.
*G01B 5/30* (2006.01)
*G01B 5/02* (2006.01)
(Continued)

(52) U.S. Cl.
CPC ............... *G01B 5/30* (2013.01); *G01B 5/02* (2013.01); *G01B 5/14* (2013.01); *G01B 5/18* (2013.01);
(Continued)

(58) Field of Classification Search
CPC ............ G01R 31/392; G01R 31/3865; G01R 31/3648; G01R 31/3658; G01B 5/00;
(Continued)

(56) References Cited

U.S. PATENT DOCUMENTS 7,511,456 B2 * 3/2009 Lee ..................... H01M 2/1061
320/116
10,184,778 B2 * 1/2019 Yoon ..................... G01B 21/08
(Continued)

FOREIGN PATENT DOCUMENTS

KR 10-2008-0074240 A 8/2008
KR 10-2008-0112003 A 12/2008
(Continued)

OTHER PUBLICATIONS

International Search Report for PCT/KR2018/001008 (PCT/ISA/210) dated May 1, 2018.

*Primary Examiner* — John Fitzgerald
*Assistant Examiner* — Truong D Phan
(74) *Attorney, Agent, or Firm* — Birch, Stewart, Kolasch & Birch, LLP

(57) ABSTRACT

Disclosed is an apparatus capable of effectively and accurately predicting a deformation characteristic in relation to swelling of a secondary battery. The secondary battery evaluation apparatus includes a fixed jig configured to hold a first secondary battery and restrict swelling of the held first secondary battery, the fixed jig measuring a change in a first reaction force of the first secondary battery according to charging and discharging cycles; a variable jig configured to
(Continued)

hold a second secondary battery and allow swelling of the held second secondary battery, the variable jig measuring a second reaction force and a first thickness change amount of the second secondary battery according to charging and discharging cycles; and a deriving unit configured to derive a relationship between the first reaction force measured by the fixed jig and the second reaction force and the first thickness change amount measured by the variable jig.

12 Claims, 6 Drawing Sheets

(51) Int. Cl.
| | | |
|---|---|---|
| *G01B 5/14* | (2006.01) | |
| *G01B 5/18* | (2006.01) | |
| *G01R 31/392* | (2019.01) | |
| *H01M 10/42* | (2006.01) | |
| *G01R 31/385* | (2019.01) | |
| *H01M 10/48* | (2006.01) | |
| *G01B 5/004* | (2006.01) | |

(52) U.S. Cl.
CPC ............ *G01R 31/392* (2019.01); *G01B 5/004* (2013.01); *G01R 31/3865* (2019.01); *H01M 10/4285* (2013.01); *H01M 10/48* (2013.01)

(58) Field of Classification Search
CPC ... G01B 5/02; G01B 5/14; G01B 5/18; G01B 5/30; H01M 10/4285; H01M 10/48; H01M 10/445; Y02E 60/12; H02J 7/009; H02J 7/0031; H02J 2007/004; H02J 7/0021; G01L 5/06; G01L 5/10; G01L 5/107; G01L 1/04; G01L 1/26; G01G 19/12; G01N 3/08; G01N 2203/0019; G01N 3/00
USPC ..... 73/862.471, 862.621, 818; 320/136, 134, 320/147, 116
See application file for complete search history.

(56) References Cited

U.S. PATENT DOCUMENTS

| | | | |
|---|---|---|---|
| 2015/0098749 A1* | 4/2015 | Grannemann | ...... F16C 11/0647 403/27 |
| 2017/0074634 A1* | 3/2017 | Yoon | ..................... G01L 5/0038 |
| 2017/0244088 A1* | 8/2017 | Narbonne | ......... H01M 10/0525 |

FOREIGN PATENT DOCUMENTS

| | | | |
|---|---|---|---|
| KR | 10-2014-0137562 A | | 12/2014 |
| KR | 2014-0140431 A | | 12/2014 |
| KR | 2015-0035268 A | | 12/2014 |
| KR | 20140140431 A | * | 12/2014 |
| KR | 10-2015-0049521 A | | 5/2015 |
| KR | 10-2016-0063278 A | | 6/2016 |

* cited by examiner

SECONDARY BATTERY EVALUATION APPARATUS

TECHNICAL FIELD

The present application claims priority to Korean Patent Application No. 10-2017-0011228 filed on Jan. 24, 2017 in the Republic of Korea, the disclosures of which are incorporated herein by reference.

The present disclosure relates to a technique of estimating a secondary battery, and more particularly, to an apparatus capable of effectively and accurately predicting a swelling characteristic due to the use or degradation of a secondary battery.

BACKGROUND ART

Secondary batteries commercially available at present include nickel-cadmium batteries, nickel-hydrogen batteries, nickel-zinc batteries, and lithium secondary batteries. Among them, lithium secondary batteries are spotlighted since they have almost no memory effect compared to nickel-based secondary batteries to ensure free charging and discharging, and also have very low self-discharge rate and high energy density.

The lithium secondary battery mainly uses a lithium-based oxide and a carbonaceous material as a positive electrode active material and a negative electrode active material, respectively. The lithium secondary battery includes an electrode assembly in which a positive electrode plate and a negative electrode plate respectively coated with a positive electrode active material and a negative electrode active material are disposed with a separator interposed therebetween, and an exterior, namely a battery case, for hermetically accommodating the electrode assembly together with an electrolyte.

Generally, the lithium secondary battery may be classified as a can-type secondary battery in which an electrode assembly is embedded in a metal can and a pouch-type secondary battery in which an electrode assembly is embedded in a pouch made of an aluminum laminate sheet, depending on the shape of the exterior.

In recent years, secondary batteries are being widely used not only in small-sized devices such as portable electronic devices but also in medium-sized and large-sized devices such as vehicles and power storage devices. For such a battery pack, a large number of secondary batteries may be electrically connected to increase capacity and power. At this time, the pouch-type secondary battery is being more widely used due to advantages such as easy stacking and light-weight.

The pouch-type secondary battery may generally be manufactured by injecting electrolyte in a state where an electrode assembly is accommodated in a pouch exterior and then sealing the pouch exterior.

FIG. 1 is an exploded perspective view showing a general pouch-type secondary battery, and FIG. 2 shows the pouch-type secondary battery of FIG. 1 in an assembled state.

As shown in FIGS. 1 and 2, the pouch-type secondary battery C may include an electrode assembly 20 and a pouch exterior 30 accommodating the electrode assembly 20.

Here, the electrode assembly 20 has a basic structure of a positive electrode plate, a negative electrode plate, and a separator interposed therebetween, and may be accommodated in an inner space formed in the pouch exterior 30. At this time, the pouch exterior 30 may be formed of an upper pouch 31 and a lower pouch 32, and sealing portions may be provided at outer circumferences of the upper pouch 31 and the lower pouch 32 so that the sealing portions are adhered to each other to seal the inner space in which the electrode assembly 20 is accommodated.

Here, at least one positive electrode tab 21 and at least one negative electrode tab 22 may extend from the positive electrode plate and the negative electrode plate, respectively. The positive electrode tab 21 and the negative electrode tab 22 may be coupled to a plate-type electrode lead 10, namely a plate-type positive electrode lead 11 and a plate-type negative electrode lead 12, respectively. In addition, the positive electrode lead 11 and the negative electrode lead 12 may be partially exposed to the outside of the pouch exterior 30 to provide an electrode terminal for electrical connection to an external configuration of the secondary battery, namely another secondary battery or an exterior device.

The secondary battery may generate gas therein due to degradation or the like as repeating charging and discharging. Also, if gas is generated therein as described above, a swelling phenomenon in which the exterior material is at least partially inflated may occur since an internal pressure increases. In particular, in case of the pouch-type secondary battery, the exterior has weak structural rigidity in comparison to the can-type secondary battery, and thus the swelling phenomenon may occur more severely.

As described above, if the swelling phenomenon occurs at the secondary battery, the internal pressure of the battery increases and the volume increases, which may adversely affect the structural stability of the battery module. Moreover, the battery module often includes a plurality of secondary batteries. In particular, in case of a middle-sized or large-sized battery module used in a vehicle or an energy storage device (ESS), a large number of secondary batteries may be included and interconnected for high output or high capacity. At this time, although the volume of each secondary battery increases only slightly due to the swelling, the deformation amount of the entire battery module may be seriously increased since the increased volume of every secondary battery is accumulated. Thus, the volume expansion caused by swelling of each secondary battery can degrade the structural stability of the battery module as a whole.

DISCLOSURE

Technical Problem

Therefore, the present disclosure is directed to providing a secondary battery evaluation apparatus capable of effectively and accurately figuring out a deformation characteristic in relation to swelling of secondary batteries.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a secondary battery evaluation apparatus, comprising: a fixed jig configured to hold a secondary battery and restrict swelling of the held secondary battery, the fixed jig measuring a change in reaction force if the secondary battery according to charging and discharging cycles; a variable jig configured to hold a secondary battery and allow swelling of the held secondary battery, the variable jig measuring a reaction force and a thickness change amount of the secondary battery according to charging and discharging cycles; and a deriving unit configured to derive a relationship between the thickness change amount and the reaction force of the secondary battery by using the reaction force measured by the fixed jig and the reaction force and the thickness change amount measured by the variable jig.

Here, the deriving unit may derive the relationship between the thickness change amount and the reaction force of the secondary battery by using the reaction force measured by the fixed jig and the reaction force and the thickness change amount measured by the variable jig, based on the same charging and discharging cycle point.

In addition, the deriving unit may derive the relationship between the thickness change amount and the reaction force of the secondary battery, based on a time point when the reaction force measured by the fixed jig is maximized.

In addition, the deriving unit may derive a graph of the reaction force according to the thickness change amount of the secondary battery.

In addition, the fixed jig may include a fixed upper jig configured to have a fixed position; a fixed lower jig located below the fixed upper jig and spaced apart from the fixed upper jig by a predetermined distance to form a retention space for the secondary battery; a fixed base member located below the fixed lower jig and spaced apart from the fixed lower jig by a predetermined distance; and a fixed measurement member interposed between the fixed base member and the fixed lower jig to measure a reaction force according to swelling of the secondary battery when the secondary battery is charged and discharged.

In addition, the variable jig may include a variable upper jig configured to be movable in a vertical direction; a variable lower jig located below the variable upper jig and spaced apart from the variable upper jig by a predetermined distance to form a retention space for the secondary battery; a variable base member located below the variable lower jig and spaced apart from the variable lower jig by a predetermined distance; a variable measurement member interposed between the variable base member and the variable lower jig to measure a reaction force according to swelling of the secondary battery when the secondary battery is charged and discharged; and an elastic member coupled to the variable upper jig to give a restoring force in a direction opposite to the movement of the variable upper jig.

In addition, the elastic member may be located above the variable upper jig so that a bottom end thereof comes into contact with the variable upper jig and a top end thereof is coupled and fixed to the variable base member.

In addition, the variable jig may include at least one bolt, and the bolt may be configured to penetrate through the variable base member, the variable lower jig, the variable upper jig and the elastic member in order in an upper direction.

In addition, the elastic member may include a lower plate having a lower surface that comes into contact with an upper surface of the variable upper jig, the bolt penetrating through the lower plate; a spring located above the lower plate and having a hollow through which the bolt penetrates; and an upper plate located above the spring and coupled and fixed to the bolt.

In addition, the variable upper jig may be configured so that the elastic member is exchangeable.

In addition, the variable jig may measure a reaction force and a thickness change amount of the secondary battery according to charging and discharging cycles for each case where a plurality of elastic members having different spring constants are coupled, and the deriving unit may derive the relationship between the thickness change amount and the reaction force of the secondary battery by using the reaction force and the thickness change amount for the plurality of elastic members, measured by the variable jig.

In addition, a plurality of elastic members may be provided to the variable jig and spaced apart from each other in a horizontal direction at an upper portion of the variable upper jig.

Advantageous Effects

According to an embodiment of the present disclosure, it is possible to accurately and efficiently measure a deformation characteristic, caused by degradation as the secondary battery is used, namely as the charging and discharging are repeated.

In particular, according to an embodiment of the present disclosure, the relationship between the deformation amount and the reaction force (load) of the secondary battery may be effectively figured out.

Further, according to an embodiment of the present disclosure, the relationship between the deformation amount and the reaction force at the end of life (EOL) at which the life span of the secondary battery ends may be derived.

Thus, according to the present disclosure, the battery module may be designed more effectively by means of the relationship obtained in this way.

Further, according to an embodiment of the present disclosure, the magnitude of the structural stiffness that the battery module must have in order to prevent swelling of the secondary battery may be effectively estimated. Alternatively, according to an embodiment of the present disclosure, the degree of deformation of the secondary battery according to the structural stiffness of the battery module may be easily predicted.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 3:
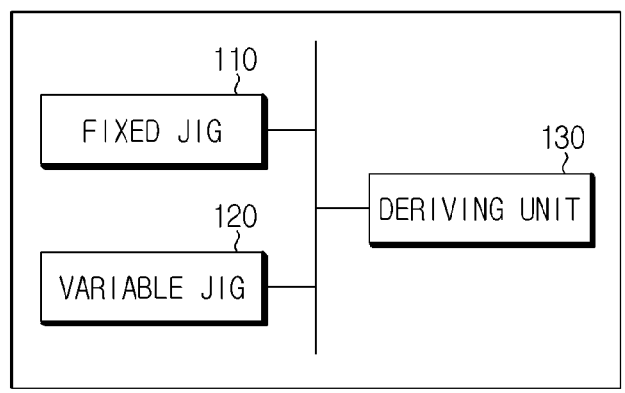
FIG. 3 is a block diagram schematically showing a secondary battery evaluation apparatus according to an embodiment of the present disclosure.

FIG. 3 is a block diagram schematically showing a secondary battery evaluation apparatus according to an embodiment of the present disclosure.

Referring to FIG. 3, the secondary battery evaluation apparatus according to the present disclosure may include a fixed jig 110, a variable jig 120 and a deriving unit 130.

The fixed jig 110 has a space for holding a secondary battery and may be configured to hold the secondary battery. In particular, the fixed jig 110 may be configured so that a pouch-type secondary battery is held in a horizontally lying-down form.

Figure 1:
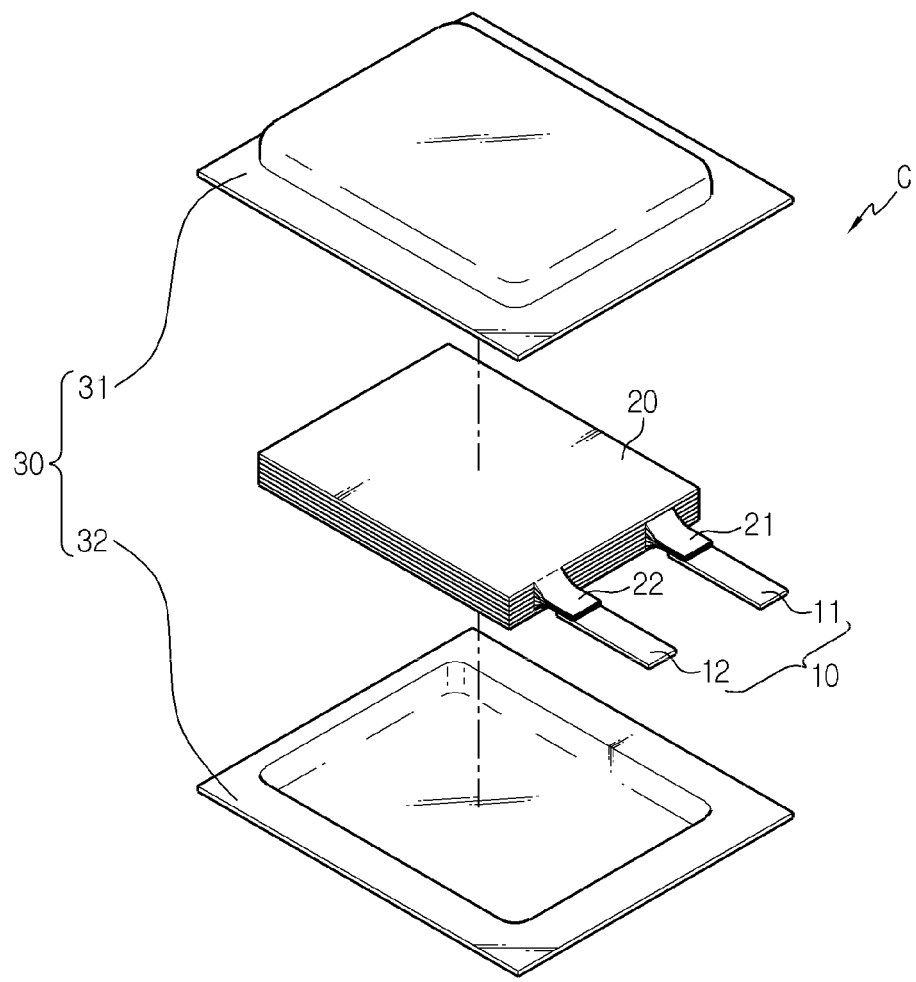
FIG. 1 is an exploded perspective view showing a general pouch-type secondary battery.
Figure 2:
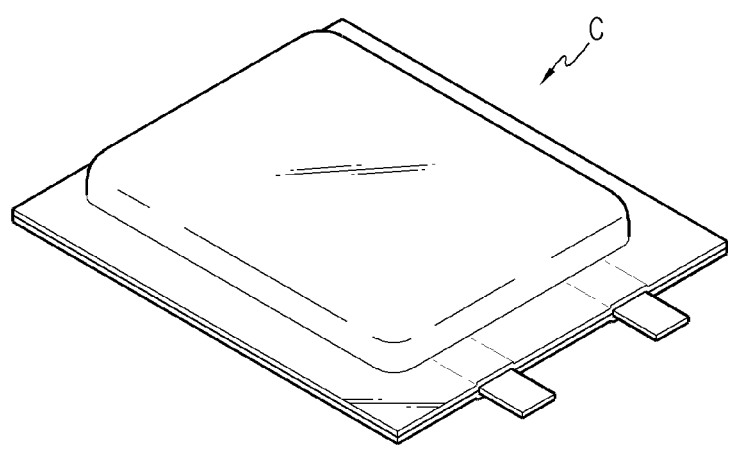
FIG. 2 shows the pouch-type secondary battery of FIG. 1 in an assembled state.

In addition, the fixed jig 110 may be configured to limit swelling of the retained secondary battery. In other words, even though an internal pressure of the secondary battery increases due to the generation of gas in the secondary battery, the fixed jig 110 may be configured not to allow the secondary battery to swell. In particular, the fixed jig 110 may limit the upward and downward swelling of the retained secondary battery. In other words, the fixed jig 110 may limit the secondary battery in a lying-down form not to swell in the surface direction (the upper and lower direction in FIG. 2).

Also, the fixed jig 110 may measure the change in reaction force depending on the charging and discharging cycle of the retained secondary battery. As an example, the fixed jig 110 will be described in detail with reference to FIG. 4.

Figure 4:
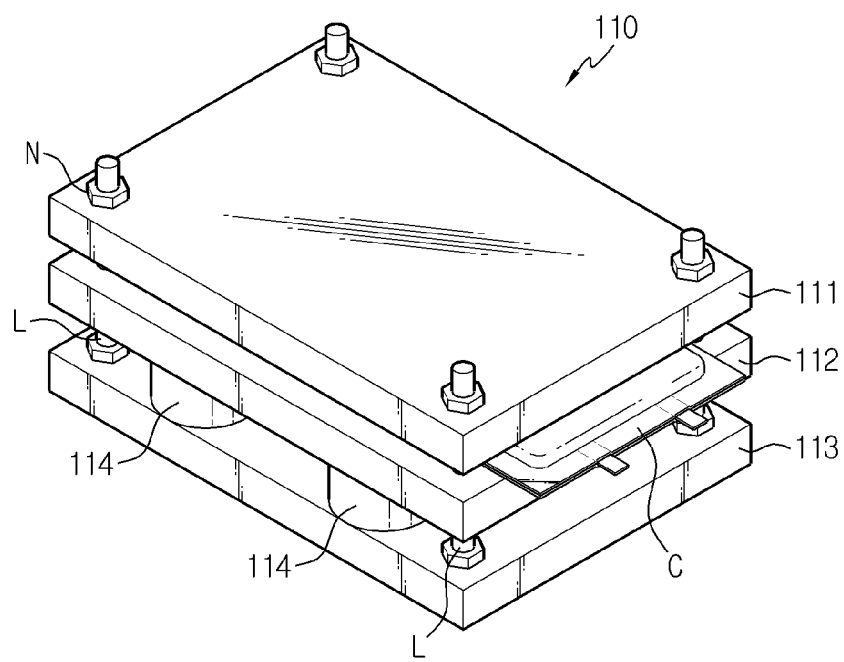
FIG. 4 is a perspective view schematically showing a fixed jig according to an embodiment of the present disclosure.

FIG. 4 is a perspective view schematically showing the fixed jig 110 according to an embodiment of the present disclosure.

Referring to FIG. 4, the fixed jig 110 may include a fixed upper jig 111, a fixed lower jig 112, a fixed base member 113 and a fixed measurement member 114.

At the fixed jig 110, the fixed upper jig 111 may be located above the space in which the secondary battery C is held. In other words, when the secondary battery C is accommodated in the fixed jig 110, the fixed upper jig 111 may be located at the top of the secondary battery C. Moreover, the fixed upper jig 111 may be configured to contact a broad upper surface of the secondary battery in a face-to-face relationship.

In addition, the fixed upper jig 111 may be configured to be fixed at a position. In particular, the fixed upper jig 111 may be fixed in the vertical direction without moving in the vertical direction. Thus, the fixed upper jig 111 may maintain its position even though the secondary battery C swells due to charge and discharge of the secondary battery C. Due to the fixed position of the fixed upper jig 111, the fixed jig 110 may limit upward swelling of the secondary battery C.

The fixed lower jig 112 may be located below the fixed upper jig 111. The fixed lower jig 112 may be spaced apart from the fixed upper jig 111 by a predetermined distance to form a space for retaining the secondary battery, namely a space for accommodating the secondary battery. The secondary battery may be accommodated in the retention space between the fixed upper jig 111 and the fixed lower jig 112. In particular, a pouch-type secondary battery may be placed between the fixed upper jig 111 and the fixed lower jig 112 in a horizontally lying-down form in which two large surfaces are oriented upward and downward. Moreover, the fixed lower jig 112 may be configured to contact a broad bottom surface of the secondary battery in a face-to-face relationship.

The fixed base member 113 may be located below the fixed lower jig 112. In addition, the fixed base member 113 may be spaced apart from the fixed lower jig 112 by a predetermined distance.

Also, the fixed base member 113 may be coupled with the fixed upper jig 111 and the fixed lower jig 112. For example, as shown in FIG. 4, the fixed upper jig 111, the fixed lower jig 112 and the fixed base member 113 may be coupled to each other in such a manner that a plurality of fastening members such as bolts L penetrates therethrough.

In particular, the fixed base member 113 and the fixed upper jig 111 may be coupled so that a separation distance therebetween does not exceed a certain level. For example, in FIG. 4, the upper and lower ends of four bolts L are protruded at the top end of the fixed upper jig 111 and the bottom end of the fixed base member 113, respectively, and nuts N may be fastened to the protruding portions. In this case, the fixed upper jig 111 and the fixed base member 113 may not be further apart from each other based on the portion where the nuts N are fastened.

Also, the fixed lower jig 112 may be configured to be movable in the vertical direction with the bolts passing therethrough. For example, at least one hole may be formed in the fixed lower jig 112, and a bolt L passing through the fixed upper jig 111 and the fixed base member 113 may pass through the hole. In addition, the fixed lower jig 112 may be configured to be movable up and down along the bolt in a state where the bolt passes through the fixed lower jig 112. However, a fixed measurement member 114 may be positioned below the fixed lower jig 112 to prevent the fixed lower jig 112 from moving downward. Thus, even though an internal pressure of the secondary battery located at an upper side increases, the positions of the fixed upper jig 111 and the fixed lower jig 112 are fixed, and the increased internal pressure of the secondary battery may be transmitted to the fixed measurement member 114 through the fixed lower jig 112.

The fixed measurement member 114 may be interposed in the space between the fixed base member 113 and the fixed lower jig 112. Also, the fixed measurement member 114 may measure the reaction force according to the swelling of the secondary battery. As the secondary battery is charged and discharged, gas may be generated inside the secondary battery, and thus the internal pressure may increase. At this time, the fixed measurement member 114 may measure the load applied to the fixed lower jig 112 due to the increase of the internal pressure as the reaction force.

For example, if the secondary battery swells as the charge and discharge cycle of the secondary battery increases, the fixed lower jig 112 may move downward and press the fixed measurement member 114 located thereunder. Then, the fixed measurement member 114 may measure the reaction force according to the degree of pressurization and quantify the same. At this time, the fixed measurement member 114 may be configured not to change its thickness even though the fixed measurement member 114 is pressed. In addition, by this, even though the internal pressure of the secondary battery increases, the fixed lower jig 112 may not move substantially downward. Thus, in this case, the thickness of the secondary battery may not change within the fixed jig 110.

The fixed measurement member 114 may be implemented using a load cell. The load cell may be deformed, for example, compressed, by the reaction force applied to the fixed lower jig 112, and the load cell may quantify the degree of deformation to measure the applied pressure.

Figure 5:
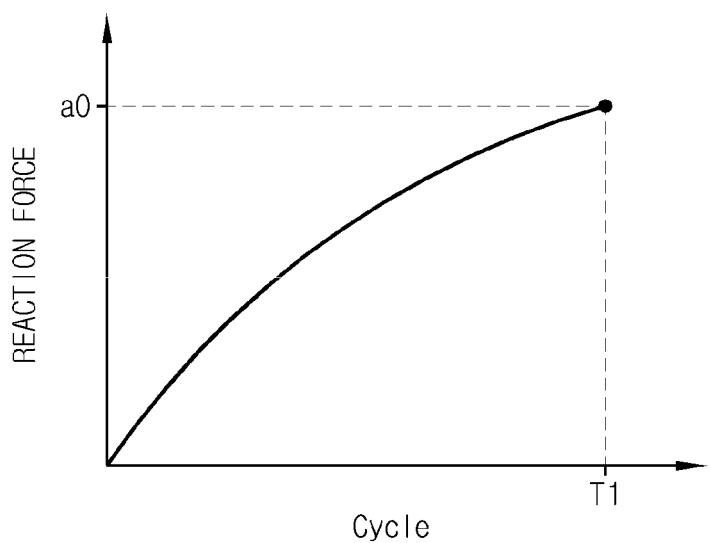
FIG. 5 shows an example of a graph showing a measurement result of a reaction force change amount, caused by the increase of cycles due to the fixed jig according to an embodiment of the present disclosure.

FIG. 5 shows an example of a graph showing a measurement result of a reaction force change amount caused by the increase of cycles, using the fixed jig 110 according to an embodiment of the present disclosure. In FIG. 5, the x-axis represents a charging and discharging cycle and may be in the unit of 'number'. In addition, in FIG. 5, the y-axis represents a reaction force and may be in the unit of 'kgf'.

Referring to FIG. 5, the secondary battery may further swell as charging and discharging are repeated, namely as the charging and discharging cycle progresses. Then, the reaction force (load) measured by the fixed measurement member 114 of the fixed jig 110 may continue to increase. In particular, the fixed measurement member 114 of the fixed jig 110 may periodically or non-periodically measure the reaction force according to swelling several times. In this case, the reaction force measured by the fixed measurement member 114 of the fixed jig 110 may be obtained in a graph form as shown in FIG. 5.

Meanwhile, the fixed upper jig 111, the fixed lower jig 112 and/or the fixed base member 113 may be formed in a flat plate shape as shown in the figure. According to this configuration of the present disclosure, the vertical size of the jig may be reduced, and the jig may stably and uniformly contact the secondary battery through a broad and flat surface. In particular, the secondary battery evaluation apparatus according to the present disclosure may evaluate a pouch-type secondary battery, and the pouch-type secondary battery may be formed into a substantially rectangular flat shape with two large surfaces. At this time, two broad surfaces of the pouch-type secondary battery may contact the lower surface of the fixed upper jig 111 and the upper surface of the fixed lower jig 112, and in this case, a broader contact area may be formed.

The variable jig 120 may be configured to have a space for holding a secondary battery to hold the secondary battery therein. Moreover, the variable jig 120 may be configured so that a pouch-type secondary battery is held in a horizontally lying state.

In particular, the variable jig 120 may be configured to allow swelling of the retained secondary battery. Moreover, the variable jig 120 may be configured to allow upward swelling of the secondary battery. In other words, unlike the fixed jig 110, the variable jig 120 may be configured to allow the secondary battery to swell in a surface direction, particularly in an upward direction, when gas is generated in the secondary battery to increase the internal pressure.

The variable jig 120 may measure the reaction force and the thickness change amount according to the charging and discharging cycle of the retained secondary battery. In particular, since the variable jig 120 allows swelling of the secondary battery, it is possible to measure the thickness change amount of the secondary battery together with the reaction force by the secondary battery. An example of the variable jig 120 will be described in more detail with reference to FIG. 6.

Figure 6:
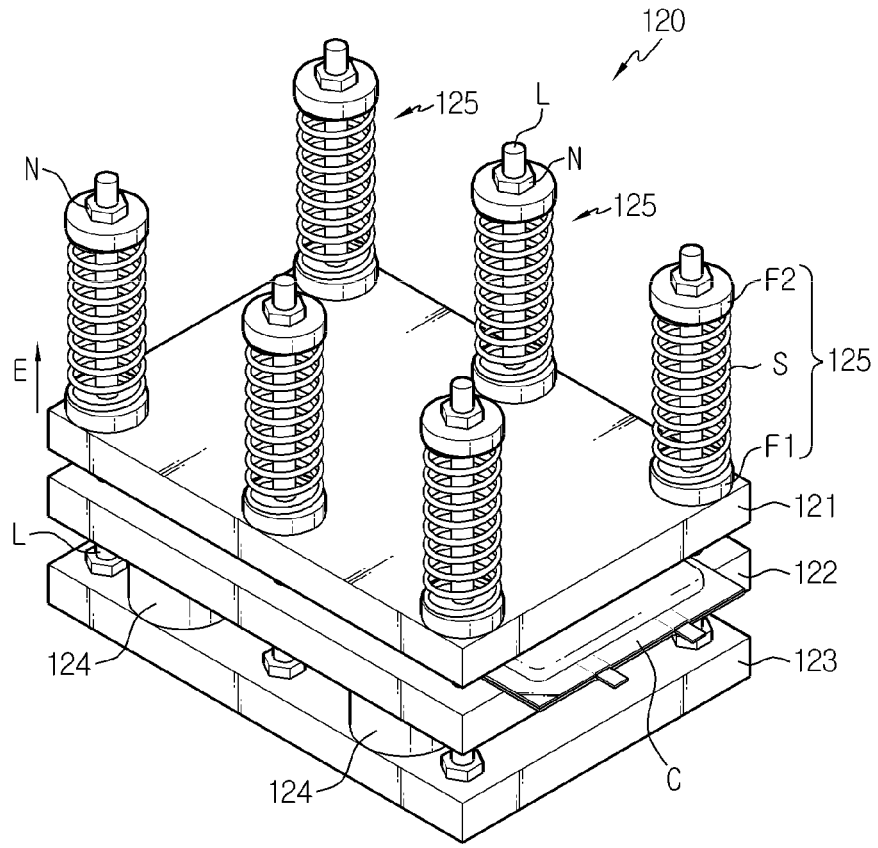
FIG. 6 is a perspective view schematically showing a variable jig according to an embodiment of the present disclosure.

FIG. 6 is a perspective view schematically showing the variable jig 120 according to an embodiment of the present disclosure.

Referring to FIG. 6, the variable jig 120 may include a variable upper jig 121, a variable lower jig 122, a variable base member 123, a variable measurement member 124 and an elastic member 125.

At the variable jig 120, the variable upper jig 121 may be located above the space in which the secondary battery is held. In other words, when the secondary battery is accommodated in the variable jig 120, the variable upper jig 121 may be located at the top of the secondary battery.

Also, the variable upper jig 121 may be configured to be movable. In particular, the variable upper jig 121 may be configured to be movable in the vertical direction. For example, as indicated by an arrow E in FIG. 6, the variable upper jig 121 may move in an upper direction. Thus, when the secondary battery swells due to charge and discharge of the secondary battery to increase its volume, the variable upper jig 121 may move to the upper direction as indicated by the arrow E, depending on the degree of swelling. In other words, since the variable upper jig 121 is movable, the variable jig 120 may allow upward swelling of the secondary battery.

The variable lower jig 122 may be located below the variable upper jig 121. In addition, the variable lower jig 122 may be spaced apart from the variable upper jig 121 by a predetermined distance to form a space for holding the secondary battery. In addition, the secondary battery may be accommodated in the holding space between the variable upper jig 121 and the variable lower jig 122. In particular, a pouch-type secondary battery may be placed between the variable upper jig 121 and the variable lower jig 122 in a horizontally lying state so that two broad surfaces are oriented upward and downward.

The variable base member 123 may be located below the variable lower jig 122. The variable base member 123 may be configured to be spaced apart from the variable lower jig 122 by a predetermined distance.

Also, the variable base member 123 may be coupled with the variable upper jig 121 and the variable lower jig 122. For example, as shown in FIG. 6, the variable upper jig 121, the variable lower jig 122 and the variable base member 123 may be coupled to each other in such a manner that a plurality of fastening members such as bolts L penetrates therethrough.

In this configuration, the variable lower jig 122 may be configured to be movable in the vertical direction in a state where the bolts L penetrate therethrough. For example, six holes are formed in the variable lower jig 122, and bolts L passing through the variable upper jig 121 and the variable base member 123 may pass through the holes. At this time, if the secondary battery located at the above swells, the variable upper jig 121 may move in the upward direction, and the variable lower jig 122 may move in the downward direction. However, the hole may be formed at an edge of the variable lower jig, rather than at a center thereof. In this configuration of the present disclosure, it is possible to secure a large space for placing the secondary battery at the top of the variable lower jig and to prevent the space of placing the secondary battery from being restricted by the bolt penetrating through the hole.

The variable measurement member 124 may be interposed in the space between the variable base member 123 and the variable lower jig 122. Also, the variable measurement member 124 may measure the reaction force caused by the swelling of secondary battery C. In other words, if gas is generated in the secondary battery so that the secondary battery swells, the variable measurement member 124 may measure the magnitude of the pressing force caused by the swelling.

For example, if the secondary battery swells due to charging and discharging of the secondary battery, the variable lower jig 122 may tend to move downward and press the variable measurement member 124 located below. If so, the variable measurement member 124 may measure the reaction force according to the degree of pressurization and quantify the same. The variable measurement member 124 may be implemented using a load cell, like the fixed measurement member 114. Also, the variable measurement member 124 may be configured such that its thickness does not change. Thus, even though the secondary battery swells, the variable lower jig 122 may substantially not move downward.

In addition, the variable measurement member 124 may measure the thickness change amount according to the charging and discharging cycle of the secondary battery. In other words, if gas is generated inside the secondary battery to increase the volume, the variable measurement member 124 may measure the degree of thickness deformation due to the swelling of the secondary battery. For example, if the secondary battery swells so that the variable upper jig 121 moves upward and the lower jig 122 moves downward, the variable measurement member 124 may measure the thickness change amount of the secondary battery by measuring a distance between the variable upper jig 121 and the variable lower jig 122.

The elastic member 125 may be coupled to the variable upper jig 121. Also, the elastic member 125 may have a structure or material having elasticity. For example, the elastic member 125 may be formed with a metal spring. As another example, the elastic member 125 may be made of a rubber material.

The elastic member 125 may be configured to form a restoring force in a direction opposite to the movement of the variable upper jig 121. For example, in FIG. 6, if the variable upper jig 121 moves in the direction E, namely in the upward direction, the elastic energy of the elastic member 125 increases, and thus a restoring force to restore in the opposite direction, namely in the downward direction, may be formed.

According to this configuration of the present disclosure, when the variable jig 120 measures the reaction force and the thickness change amount according to the swelling of the secondary battery, the stiffness or elasticity of a structure surrounding the secondary battery may be similarly implemented. For example, the secondary battery may be surrounded by a case or cartridge, and the case or the cartridge may have a certain level of elasticity. In the configuration of the present disclosure, the case and the cartridge may be implemented using the elastic member 125, and thus in the actual battery module, the swelling characteristic of the secondary battery may be more accurately and easily figured out in consideration of the rigidity or the like of surrounding structures.

Preferably, the elastic member 125 may be located above the variable upper jig 121.

For example, as shown in FIG. 6, the elastic member 125 may be located at the top of the variable upper jig 121. In this case, the bottom end of the elastic member 125 may be configured to contact the variable upper jig 121. Thus, if the upper jig 121 moves upward due to swelling of the secondary battery, the bottom end of the elastic member 125 may move upward.

At this time, if the top end of the variable upper jig 121 is configured to be movable, when the variable upper jig 121 moves upward, the top end of the elastic member 125 may also move upward, and thus the elastic member 125 may not be appropriately compressed. Thus, the top end of the elastic member 125 is preferably fixed at a constant position.

In particular, the top end of the elastic member 125 may be coupled and fixed to the variable base member 123. If the top end of the elastic member 125 is coupled and fixed to the variable base member 123 as described above, the distance between the elastic member 125 and the variable base member 123 may be kept constant. Thus, even though the secondary battery swells so that the variable upper jig 121 moves upward and the bottom end of the elastic member 125 moves upward, the top end of the elastic member 125 may be fixed at a certain position. Thus, as the distance between the top end and the bottom end of the elastic member 125 becomes shorter, the elastic member 125 may be compressed to increase the elastic energy, and a force to restore in the opposite direction may be formed.

According to this configuration of the present disclosure, the top end of the elastic member 125 need not be fixed to a structure other than the variable jig 120. Thus, the variable jig 120 may be configured independently, which may allow free movement of the variable jig 120 and reduce the volume of the variable jig 120.

More preferably, the variable jig 120 may include at least one bolt. For example, as shown in FIG. 6, the variable jig 120 may include a plurality of bolts N elongating in a vertical direction. In addition, the bolts may be configured to sequentially pass through the variable base member 123, the variable lower jig 122, the variable upper jig 121 and the elastic member 125 from the lower side to the upper side.

According to this configuration of the present disclosure, various components (the variable base member 123, the variable lower jig 122, the variable upper jig 121 and the elastic member 125) included in the variable jig 120 may be coupled to each other by using a single element (bolt). Moreover, since the bolt is configured to penetrate through these components, respectively, an element for coupling them is substantially not exposed, and the overall volume may be reduced.

Further, the elastic member 125 may have a lower plate, a spring and an upper plate.

For example, in FIG. 6, the variable jig 120 may include six elastic members 125, and each elastic member 125 may have a lower plate F1, a spring S and an upper plate F2.

Here, the lower plate F1 may be configured in the form of a flat plate, and the lower surface of the lower plate F1 may contact the upper surface of the variable upper jig 121. In addition, a bolt may penetrate through the lower plate.

Also, the spring S is placed on the upper portion of the lower plate and may be made of, for example, a metal material. The spring may be formed in a spiral shape so that a bolt penetrates through its hollow.

In addition, the upper plate F2 may be configured in the form of a flat plate and positioned at the upper portion of the spring. Moreover, the upper plate may be coupled and fixed to the bolt. For example, the upper plate may be coupled and fixed to the bolt in such a manner that the bolt passing through the variable base member 123, the variable lower jig 122, the variable upper jig 121, the lower plate and the spring penetrates through the upper plate to expose a top end of the bolt is exposed upwards, and a nut N is coupled to the exposed portion of the bolt.

According to this configuration of the present disclosure, the upper portion of the spring may be stably fixed by the upper plate. Also, in this case, when the variable upper jig 121 moves upward due to swelling of the secondary battery, the pressing force applied to the spring may be uniformly transmitted to the lower portion of the spring by the lower plate. Thus, it is possible to restrict irregular detachment or deformation of the spring by the pressing force when the secondary battery swells.

Figure 7:
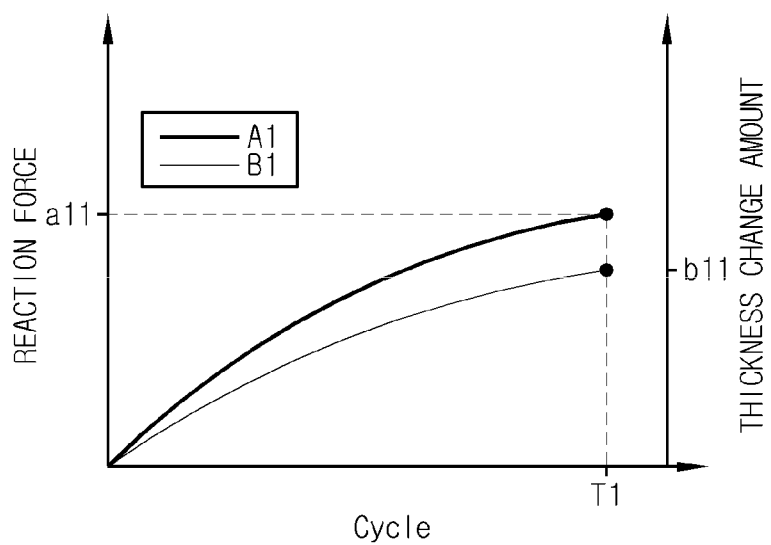
FIG. 7 shows an example of a graph showing a reaction force change amount and a thickness change amount caused by charging and discharging, measured by the variable jig according to an embodiment of the present disclosure.

FIG. 7 shows an example of a graph showing a reaction force change amount and a thickness change amount caused by charging and discharging, measured by the variable jig 120 according to an embodiment of the present disclosure. In FIG. 7, the x-axis represents a charging and discharging cycle and may be in the unit of 'number'. In addition, the y-axis represents a reaction force or a thickness change amount and may be in the unit of 'kg' or 'mm'.

Referring to FIG. 7, the reaction force measured by the variable measurement member 124 of variable jig 120 may also continue to increase as the secondary battery performs charging and discharging. In addition, the variable measurement member 124 of the variable jig 120 may also periodically or non-periodically measure the reaction force caused by the swelling several times so that the changing tendency of the reaction force may be obtained using a single line such as a curve as indicated by A1 in FIG. 7.

Also, at the variable jig 120, the secondary battery may swell as gas is generated therein due to repeated charging and discharging. Thus, the thickness of the secondary battery may gradually increase as the charging and discharging cycle increases. For this reason, the deformation amount, namely the thickness change amount, of the secondary battery measured by the variable jig 120 may be expressed with a curve gradually increasing with time, as indicated by A2 in FIG. 7.

The deriving unit 130 may derive the relationship between the thickness change amount and the reaction force of the secondary battery by using the reaction force measured by the fixed jig 110 and the reaction force and the thickness change amount measured by the variable jig 120.

For example, the deriving unit 130 may derive the relationship between the thickness change amount and the reaction force of the secondary battery by using a reaction force at a predetermined time point in the reaction force measured by the fixed jig 110 and a reaction force and a the thickness change amount at a predetermined time point in the reaction force and the thickness change amount measured by the variable jig 120.

Preferably, the deriving unit 130 may derive the relationship between the thickness change amount and the reaction force of the secondary battery based on the same charging and discharging cycle point. In other words, the deriving unit 130 may derive the relationship between the thickness change amount and the reaction force of the secondary battery by using the reaction force measured by the fixed jig 110 and the reaction force and the thickness change amount measured by the variable jig 120 at the same charging and discharging cycle point.

For example, in the graph of FIG. 5, the deriving unit 130 may obtain a y coordinate (a0) at a time point T1 on the graph of the reaction force of the secondary battery obtained by the fixed jig 110. In addition, the y coordinate (a0) may be regarded as the reaction force of the secondary battery at T1.

In addition, in the graph of FIG. 7, the deriving unit 130 may obtain a y coordinate (a11) at the time point T1 on the graph A1 of the reaction force obtained by the variable jig 120. Also, the deriving unit 130 may obtain a y coordinate (b11) at the time point T1 on the graph B1 of the deformation amount of the secondary battery obtained by the variable jig 120.

The deriving unit 130 may derive the relationship between the thickness change amount and the reaction force of the secondary battery by using the reaction force and the deformation amount (the thickness change amount) obtained at a predetermined time by the fixed jig 110 and the variable jig 120.

Here, the deriving unit 130 may derive the relationship between the thickness change amount and the reaction force of the secondary battery based on a time point at which the reaction force measured by the fixed jig 110 is maximized.

For example, in the graph of FIG. 5, the time point at which the reaction force of the battery reaches maximum may be T1. Thus, if the cycle point T1 at which the reaction force of the battery becomes maximum by the fixed jig 110 is determined, the reaction force and the thickness change amount measured by the variable jig 120 may be extracted based on the time point T1.

In particular, the life span of the secondary battery may be roughly predicted or determined when the battery is manufactured. Thus, the time point for predicting the reaction force and the thickness change amount may be determined based on the predicted or predetermined life span.

For example, if the life span of a specific secondary battery is predicted to be 5000 cycles, the time point T1 may be set to 5000 cycles for the corresponding secondary battery in the graphs of FIGS. 5 and 7. Thus, in this case, the reaction force of the secondary battery by the fixed jig 110 and the reaction force and the thickness change amount of the secondary battery by the variable jig 120 at the time point of 5000 cycles may be extracted.

The deriving unit 130 may derive a graph of the reaction force according to the thickness change amount of the secondary battery.

In particular, the deriving unit 130 may derive a graph on a coordinate plane in which the deformation amount, namely the thickness change amount, of the secondary battery is x axis x-axis, and the reaction force of the secondary battery is y-axis.

In this case, the deriving unit 130 may derive a graph of the deformation amount and the reaction force of the secondary battery by using the reaction force at a predetermined time point obtained by the fixed jig 110 and the reaction force and the deformation amount at a predetermined time point obtained by the variable jig 120.

Figure 8:
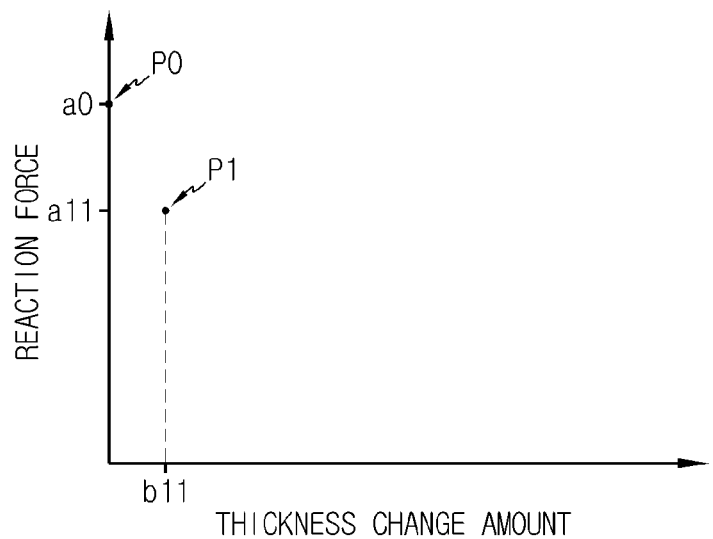
FIG. 8 is a diagram schematically showing a configuration for deriving the relationship between a thickness change amount and a reaction force of a secondary battery by a deriving unit according to an embodiment of the present disclosure.

FIG. 8 is a diagram schematically showing a configuration for deriving the relationship between a deformation amount and a reaction force of a secondary battery by the deriving unit 130 according to an embodiment of the present disclosure.

Referring to FIG. 8, the deriving unit 130 may set a coordinate plane where the x-axis represents the thickness change amount of the secondary battery and the y-axis represents the reaction force of the secondary battery. Here, the x-axis may be in the unit of length, for example 'mm', and the y-axis may be in the unit of force or weight, for example 'kgf'.

In addition, on the coordinate plane, the deriving unit 130 may represent the reaction force at the time point T1 obtained by the fixed jig 110 by using a single point. For example, in the graph of FIG. 5, a0 that is the reaction force at the time point T1 may become a y coordinate. Also, since there is substantially no thickness change amount of the battery at the fixed jig 110, the x coordinate at this time may be 0 (zero). Thus, the deriving unit 130 may obtain a coordinate point P0 (0, a0) by the fixed jig 110. In other words, the deriving unit 130 may input the reaction force obtained by the fixed jig 110 on the coordinate plane of the deformation amount and the reaction force as a y-intercept.

Also, the deriving unit 130 may represent at least one point in the coordinate plane by using the deformation amount and the reaction force at the time point T1 obtained by the variable jig 120. For example, in the graph of FIG. 7, a single point P1 having a coordinate (b11, a11) may be obtained by setting b11 that is the thickness change amount (the deformation amount) at the time point T1 as an x coordinate and a11 that is the reaction force at the time point T1 as a y coordinate.

As described above, by using the two points (P0, P1) obtained by the fixed jig 110 and the variable jig 120, the deriving unit 130 may obtain a single line. In other words, the deriving unit 130 may obtain a single graph by connecting the points obtained by the fixed jig 110 and the variable jig 120 to each other.

In particular, the variable jig 120 may include an elastic member 125, and the elastic member 125 may be configured to be exchangeable.

For example, in FIG. 6, the variable upper jig 121 is coupled to the elastic member 125, and the variable upper jig 121 may be configured so that the elastic member 125 is exchangeable.

In this case, the variable jig 120 may be configured so that the elastic member 125 is exchanged with another kind of elastic member 125. In particular, the variable jig 120 may be configured so that the elastic member 125 is exchanged with an elastic member 125 having a different spring constant. For example, the variable upper jig 121 and the elastic member 125 included in the variable jig 120 may be configured to be detachable and fastenable by being coupled to each other with a hooking structure. Alternatively, the variable upper jig 121 and the elastic member 125 may be configured to be detachable and fastenable by being coupled to each other with a fitting structure. For example, an upper portion of the variable upper jig 121 may have an insertion groove formed in a size and shape corresponding to a lower outer shape of the elastic member 125, and a lower portion of the elastic member 125 may be inserted into the insertion groove.

Further, the elastic member 125 may be in the form of a spring made of metal and having a spiral shape. In this case, different kinds of elastic bodies having different spring constants may be coupled to the variable upper jig 121 as a substitution.

In particular, the elastic member 125 may be positioned at the top of the variable upper jig 121 and coupled to the variable upper jig 121. In this case, the elastic member 125 may be exchanged more easily.

In a configuration where the elastic member 125 is easily exchangeable, if the elastic members 125 having different spring constants are coupled to the variable jig 120, the variable jig 120 may measure the reaction force and the thickness change amount according to the charging and discharging cycle of the secondary battery, respectively for each case where each elastic member 125 is coupled.

Figure 9:
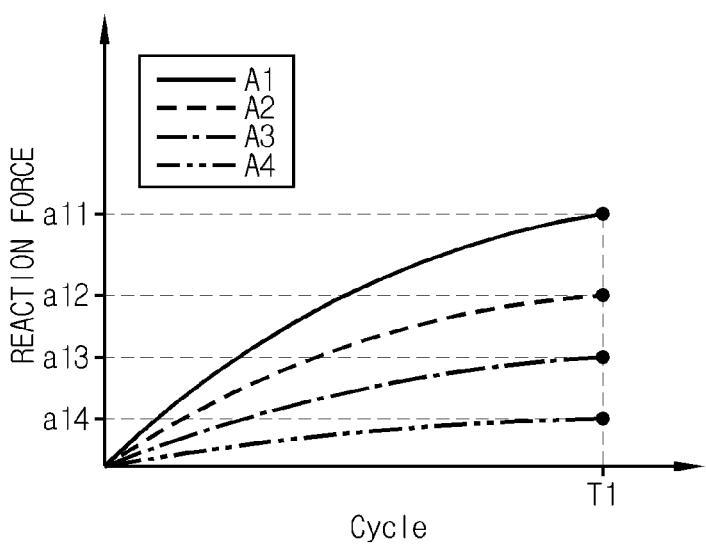
FIG. 9 is a graph showing a reaction force change according to the cycle in various cases where elastic members having different spring constants are coupled according to an embodiment of the present disclosure.
Figure 10:
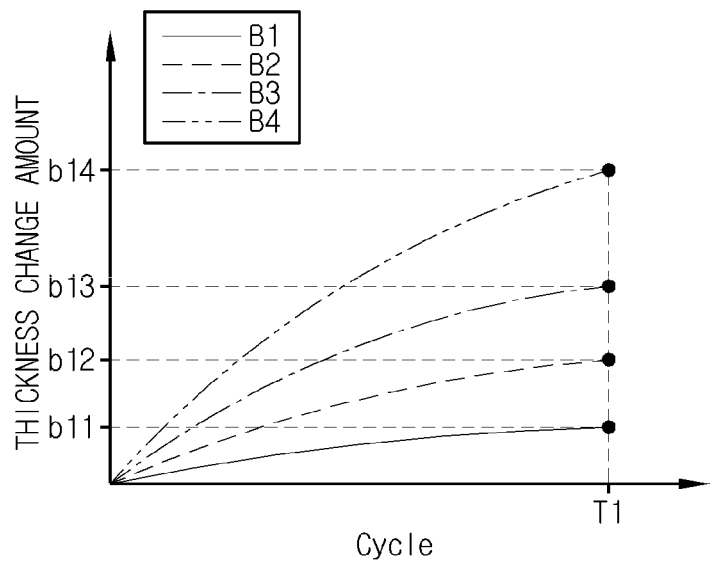
FIG. 10 is a graph showing a thickness change amount according to the cycle in various cases where elastic members having different spring constants are coupled according to an embodiment of the present disclosure.

FIG. 9 is a graph showing a reaction force change according to the cycle in various cases where elastic members having different spring constants are coupled according to an embodiment of the present disclosure, and FIG. 10 is a graph showing a thickness change amount according to the cycle in various cases where elastic members 125 having different spring constants are coupled according to an embodiment of the present disclosure. In FIG. 9, the x-axis represents a charging and discharging cycle and may be in the unit of 'number'. In addition, the y-axis represents a reaction force and may be in the unit of 'kgf'. Moreover, in FIG. 10, the x-axis represents a charging and discharging cycle and may be in the unit of 'number'. In addition, the y-axis represents a thickness change amount and may be in the unit of 'mm'.

Referring to FIGS. 9 and 10, first, a reaction force graph A1 and a thickness change amount graph B1 are shown in the same form as shown in FIG. 7. In addition, the reaction force of the graph A1 and the thickness change amount of the graph B1 at the time point T1 may be a11 and b11, respectively. Thus, in a coordinate plane of the thickness change amount, and the reaction force, where the x-axis represents the deformation amount and the y-axis represents the reaction force, a coordinate point (b11, a11) may be obtained (P1), identical to the case of FIG. 8.

However, if an elastic member 125 having a lower spring constant is included in the variable jig 120 in comparison to the case where the graphs A1 and B1 are derived, the reaction force is lowered. Thus, as shown in FIG. 9, the reaction force graph may be obtained in the form of a graph A2 having a lower reaction force than the graph A1. In addition, as the spring constant is lowered, the thickness change amount of the battery may increase. Thus, as shown in FIG. 10, the deformation amount graph may be obtained in the form of a graph B2 having a higher thickness change amount in comparison to the graph B1. In this case, the thickness change amount and the reaction force at the time point T1 may be derived as b12 and a12. Thus, a coordinate point (b12, a12) may be obtained on the coordinate plane of the thickness change amount and the reaction force (P2).

Likewise, if an elastic member 125 having a lower spring constant is included in the variable jig 120 in comparison to the case where the graphs A2 and B2 are derived, as shown in the graphs A3 and B3 at FIGS. 9 and 10, the reaction force may become smaller and the thickness change amount may become larger. In this case, the thickness change amount value and the reaction force value at the time point T1 may be derived as b13 and a13. Thus, a coordinate point (b13, a13) may be obtained on the coordinate plane of the thickness change amount and the reaction force (P3).

In addition, if an elastic member 125 having a lower spring constant is included in the variable jig 120 in comparison to the case of the graphs A3 and B3, as shown in the graphs A4 and B4 at FIGS. 9 and 10, a graph in which the reaction force becomes smaller and the thickness change amount becomes larger may be obtained. In this case, the thickness change amount and the reaction force at the time point T1 may be derived as b14 and a14. Thus, a coordinate point (b14, a14) may be obtained on the coordinate plane of the thickness change amount and the reaction force (P4).

In the graphs of FIGS. 9 to 10, the graphs of A1 to A4 and B1 to B4 may be respectively obtained by varying the spring constant corresponding to the rigidity of the module case or the cartridge surrounding the secondary battery in the battery module. For example, the graphs of FIGS. 9 to 10 may be derived by changing the spring constant of the elastic member to 50 kgf, 100 kgf, 200 kgf, and 10,000 kgf.

In addition, if a plurality of coordinate points are obtained by varying the spring constants as described above, the deriving unit 130 may obtain the graph of the deformation amount and the reaction force by using the coordinate points. In other words, if the reaction force and the thickness change amount according to the charging and discharging cycle are measured by the variable jig 120 for every case where a plurality of elastic members 125 having different spring constants are coupled, the deriving unit 130 may derive the relationship between the deformation amount and the reaction force of the secondary battery by using the measurement results.

Figure 11:
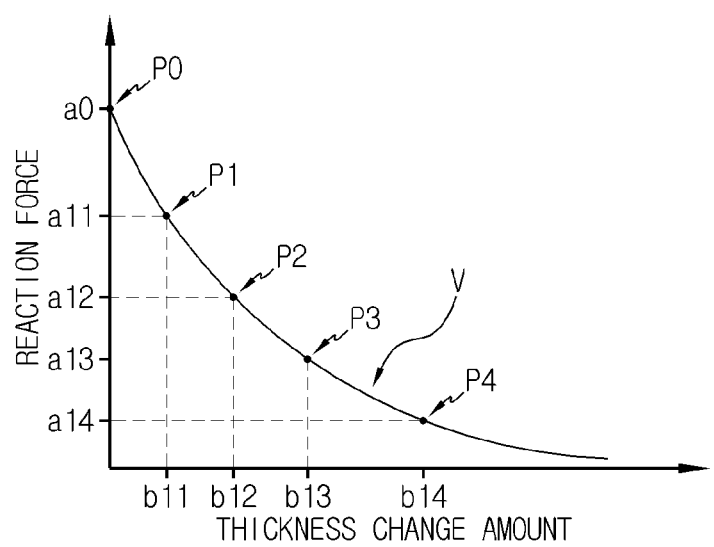
FIG. 11 is a graph showing the relationship between the thickness change amount and the reaction force in various cases having different spring constants according to an embodiment of the present disclosure.

FIG. 11 is a graph showing the relationship between the deformation amount and the reaction force in various cases having different spring constants according to an embodiment of the present disclosure. Here, the x-axis may be in the unit of length, for example 'mm', and the y-axis may be in the unit of force or weight, for example 'kgf'.

Referring to FIG. 11, the deriving unit 130 may represent one point (P0) on the y-axis by using the coordinate point (0, a0) obtained by the fixed jig 110 in the embodiment of FIG. 5, on the coordinate plane of the deformation amount and the reaction force. Also, the deriving unit 130 may display four coordinate points (P1, P2, P3, P4) obtained by the variable jig 120 while varying the spring constant in the embodiment of FIGS. 9 and 10, on the coordinate plane.

In addition, the deriving unit 130 may obtain a single line V by using the five points (P0 to P5) displayed as above. In particular, the deriving unit 130 may derive a single curve V by using the five points. In addition, the curve V derived as above may be a graph showing the relationship between the deformation amount and the reaction force of the secondary battery. Further, the deriving unit 130 may obtain a more precise curve when there are more coordinate points of cases having different spring constants.

The curve V of the deformation amount and the reaction force obtained as above may be used in designing a battery module including a plurality of secondary batteries.

For example, if the battery module includes a cartridge to surround at least one secondary battery, the curve of the deformation amount and the reaction force may be obtained by using the spring constant of the cartridge. In addition, by deriving the force applied to the cartridge according to the deformation amount of the secondary battery, the rigidity of the cartridge may be appropriately designed. Alternatively, the deformation amount of the secondary battery may be easily predicted or controlled depending on the rigidity of the cartridge.

As another example, if the battery module includes a plurality of secondary batteries that are accommodated in a single module case, the curve of the deformation amount and the reaction force of the entire module may be obtained. In addition, as the force applied to the module case is derived according to the deformation amount of the secondary battery, the rigidity of the module case may be designed within an appropriate range. In addition, the deformation amount of the secondary battery may be controlled by means of the rigidity or structure of the module case.

Meanwhile, when the reaction force according to the charging and discharging cycle is measured by the fixed jig and the reaction force and the thickness change amount according to the charging and discharging cycle are measured by the variable jig, the charging and discharging cycle test conditions, for example test temperature, C-rate, SOC range and the like, may be set identically. In addition, in each case where the variable jig includes various kinds of elastic members with different spring constants, it is recommended that the charging and discharging cycle test conditions are set identically.

Preferably, a plurality of elastic members 125 may be provided to the variable jig 120. For example, as shown in FIG. 6, six elastic members 125 may be provided at the upper portion of the variable jig 120.

In addition, the plurality of elastic members 125 may be spaced from the upper portion of the variable upper jig 121 by a predetermined distance in the horizontal direction. For example, as shown in FIG. 6, the plurality of elastic members 125 may be positioned at corners of the variable upper jig 121 at the upper portion of the variable upper jig 121 and be spaced apart from each other by a predetermined distance.

If the elastic members 125 are located at the corners of the variable upper jig 121 as described above, the bolt L may easily avoid the secondary battery C. In other words, in this embodiment, the bolt L passing through the elastic member may pass through both the variable upper jig 121 and the variable lower jig 122, and here, the secondary battery is located between the variable upper jig 121 and the variable lower jig 122. At this time, if the bolt L is located at the corner of the variable upper jig 121 and the lower jig 122, the space for accommodating the secondary battery may be secured widely between the variable upper jig 121 and the variable lower jig 122.

In addition, according to this configuration of the present disclosure, the reaction force caused by the swelling of the secondary battery may be uniformly formed by the elastic member 125 since the elastic force by the elastic member 125 is not concentrated on a specific portion of the variable upper jig 121 or the secondary battery located thereunder but spreads widely.

The variable upper jig 121 and/or the variable lower jig 122 may be configured not to be easily bent by an external force, like a rigid body. In particular, the variable upper jig 121 and/or the variable lower jig 122 may be configured not to be bent by the swelling of the secondary battery or the pressing of the elastic member 125. In this case, the force caused by the swelling of the secondary battery or to the pressing of the elastic member 125 may be uniformly transferred to the variable upper jig 121 or the variable lower jig 122, thereby enabling more accurate measurement of the deformation amount and the reaction force.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, when the terms indicating directions such as up and down directions are used in the specification, it is obvious to those skilled in the art that these merely represent relative locations for convenience in explanation and may vary based on a location of an observer or an object.

REFERENCE SIGNS

110: fixed jig
111: fixed upper jig, 112: fixed lower jig, 113: fixed base member, 114: fixed measurement member
120: variable jig
121: variable upper jig, 122: variable lower jig, 123: variable base member, 124: variable measurement member, 125: elastic member
130: deriving unit

What is claimed is:

1. A secondary battery evaluation apparatus, comprising:
a fixed jig configured to hold a first secondary battery and restrict swelling of the first secondary battery, the fixed jig measuring a change in a first reaction force of the first secondary battery according to charging and discharging cycles;
a variable jig configured to hold a second secondary battery and allow swelling of the second secondary battery, the variable jig measuring a second reaction force and a first thickness change amount of the second secondary battery according to charging and discharging cycles; and
a deriving unit configured to derive a relationship between the first reaction force measured by the fixed jig and the second reaction force and the first thickness change amount measured by the variable jig.

2. The secondary battery evaluation apparatus according to claim 1, wherein the deriving unit derives a graph of the second reaction force according to the first thickness change amount of the second secondary battery.

3. The secondary battery evaluation apparatus according to claim 1, wherein the fixed jig includes:
a fixed upper jig configured to have a fixed position;
a fixed lower jig located below the fixed upper jig and spaced apart from the fixed upper jig by a predetermined distance to form a retention space for the first secondary battery;
a fixed base member located below the fixed lower jig and spaced apart from the fixed lower jig by a predetermined distance; and
a fixed measurement member interposed between the fixed base member and the fixed lower jig to measure a first reaction force according to swelling of the first secondary battery when the first secondary battery is charged and discharged.

4. The secondary battery evaluation apparatus according to claim 1, wherein the deriving unit derives the relationship between the first reaction force measured by the fixed jig and the second reaction force and the first thickness change amount measured by the variable jig, based on the on a same charging and discharging cycle point.

5. The secondary battery evaluation apparatus according to claim 4, wherein the deriving unit derives the relationship between the first reaction force measured by the fixed jig, the first thickness change amount and the second reaction force of the second secondary battery, based on a time point when the first reaction force measured by the fixed jig is maximized.

6. The secondary battery evaluation apparatus according to claim 1, wherein the variable jig includes:
a variable upper jig configured to be movable in a vertical direction;
a variable lower jig located below the variable upper jig and spaced apart from the variable upper jig by a predetermined distance to form a retention space for the second secondary battery;
a variable base member located below the variable lower jig and spaced apart from the variable lower jig by a predetermined distance;
a variable measurement member interposed between the variable base member and the variable lower jig to measure a second reaction force according to swelling of the second secondary battery when the second secondary battery is charged and discharged; and
an elastic member coupled to the variable upper jig to give a restoring force in a direction opposite to the movement of the variable upper jig.

7. The secondary battery evaluation apparatus according to claim 6, wherein a plurality of elastic members are provided to the variable jig and spaced apart from each other in a horizontal direction at an upper portion of the variable upper jig.

8. The secondary battery evaluation apparatus according to claim 6, wherein the variable upper jig is configured so that the elastic member is exchangeable.

9. The secondary battery evaluation apparatus according to claim 8, wherein the variable jig measures a reaction force and a thickness change amount of a plurality of secondary batteries according to charging and discharging cycles for each of the plurality of secondary batteries where a plurality of elastic members having different spring constants are coupled for each of the plurality of secondary batteries, respectively, and
wherein the deriving unit derives the relationship between the thickness change amounts and the reaction forces of the plurality of secondary batteries by using the reaction forces and the thickness change amounts for the plurality of elastic members, measured by the variable jig.

10. The secondary battery evaluation apparatus according to claim 6, wherein the elastic member is located above the variable upper jig so that a bottom end thereof comes into contact with the variable upper jig and a top end thereof is coupled and fixed to the variable base member.

11. The secondary battery evaluation apparatus according to claim 10, wherein the variable jig includes at least one bolt, and the bolt is configured to penetrate through the variable base member, the variable lower jig, the variable upper jig and the elastic member in order in an upper direction.

12. The secondary battery evaluation apparatus according to claim 11, wherein the elastic member includes:
a lower plate having a lower surface that comes into contact with an upper surface of the variable upper jig, the bolt penetrating through the lower plate;
a spring located above the lower plate and having a hollow through which the bolt penetrates; and
an upper plate located above the spring and coupled and fixed to the bolt.

* * * * *